United States Patent
Yang

(10) Patent No.: US 9,802,240 B2
(45) Date of Patent: Oct. 31, 2017

(54) THIN HEAT PIPE STRUCTURE AND MANUFACTURING METHOD THEREOF

(71) Applicant: Asia Vital Components Co., Ltd., New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 776 days.

(21) Appl. No.: 14/184,301

(22) Filed: Feb. 19, 2014

(65) Prior Publication Data

US 2014/0165401 A1     Jun. 19, 2014

Related U.S. Application Data

(62) Division of application No. 13/154,690, filed on Jun. 7, 2011, now abandoned.

(51) Int. Cl.
| | |
|---|---|
| *H01L 23/427* | (2006.01) |
| *F28D 15/04* | (2006.01) |
| *B21D 53/06* | (2006.01) |
| *B21D 53/02* | (2006.01) |

(52) U.S. Cl.
CPC .............. *B21D 53/06* (2013.01); *B21D 53/02* (2013.01); *F28D 15/04* (2013.01); *F28D 15/046* (2013.01); *H01L 23/427* (2013.01); *H01L 2924/0002* (2013.01); *Y10T 29/49353* (2015.01)

(58) Field of Classification Search
CPC ......... B21D 53/06; B21D 53/02; F28D 15/04; F28D 15/046; H01L 23/427; H01L 2924/0002; H01L 2924/00; Y10T 29/49353
USPC .......................... 165/104.21, 104.26, 104.22
See application file for complete search history.

(56) References Cited

U.S. PATENT DOCUMENTS

| | | | |
|---|---|---|---|
| 3,665,573 A * | 5/1972 | Werner | B21C 37/06 165/104.26 |
| 4,489,777 A | 12/1984 | Del Bagno et al. | |
| 5,761,037 A * | 6/1998 | Anderson | F28D 15/0266 165/104.26 |
| 6,725,910 B2 * | 4/2004 | Ishida | B21C 37/151 165/104.21 |
| 6,997,245 B2 | 2/2006 | Lindemuth et al. | |
| 7,293,601 B2 | 11/2007 | Huang | |
| 2006/0098411 A1 * | 5/2006 | Lee | F28D 15/0233 361/704 |
| 2006/0144565 A1 | 7/2006 | Tsai et al. | |
| 2007/0056714 A1 * | 3/2007 | Wong | F28D 15/0233 165/104.26 |

(Continued)

*Primary Examiner* — David Bryant
*Assistant Examiner* — Lawrence Averick
(74) *Attorney, Agent, or Firm* — C. G. Mersereau; Nikolai & Mersereau, P.A.

(57) ABSTRACT

A thin heat pipe structure and a manufacturing method thereof. The thin heat pipe structure includes a tubular body and a mesh body. The tubular body has a chamber and a working fluid. At least one first channel and at least one second channel are formed on an inner wall face of the chamber. The first and second channels extend to intersect each other. The mesh body is attached to the inner wall face of the chamber. The thin heat pipe structure is able to transfer heat in both axial direction and radial direction. By means of the manufacturing method, the heat pipe can be slimmed and the ratio of good products can be greatly increased.

5 Claims, 13 Drawing Sheets

(56) References Cited

U.S. PATENT DOCUMENTS

| | | | | |
|---|---|---|---|---|
| 2007/0240858 A1* | 10/2007 | Hou | ................... | F28D 15/046 |
| | | | | 165/104.26 |
| 2007/0267179 A1* | 11/2007 | Hou | ................... | F28D 15/046 |
| | | | | 165/104.26 |
| 2008/0040925 A1* | 2/2008 | Lee | ................... | F28D 15/0233 |
| | | | | 29/890.03 |
| 2009/0166004 A1* | 7/2009 | Lai | ................... | F28D 15/046 |
| | | | | 165/104.26 |
| 2010/0307003 A1* | 12/2010 | Hoffman | ............... | F28D 15/046 |
| | | | | 29/890.032 |
| 2010/0319882 A1* | 12/2010 | Lee | ................... | F28D 15/046 |
| | | | | 165/104.26 |
| 2011/0100608 A1* | 5/2011 | Huang | ................ | F28D 15/0233 |
| | | | | 165/104.26 |
| 2012/0111541 A1* | 5/2012 | Yan | ................... | H01L 23/427 |
| | | | | 165/104.26 |
| 2012/0175084 A1* | 7/2012 | Horng | ................... | F28D 15/02 |
| | | | | 165/104.26 |
| 2014/0150263 A1* | 6/2014 | Wu | ................... | B23P 15/26 |
| | | | | 29/890.032 |

* cited by examiner

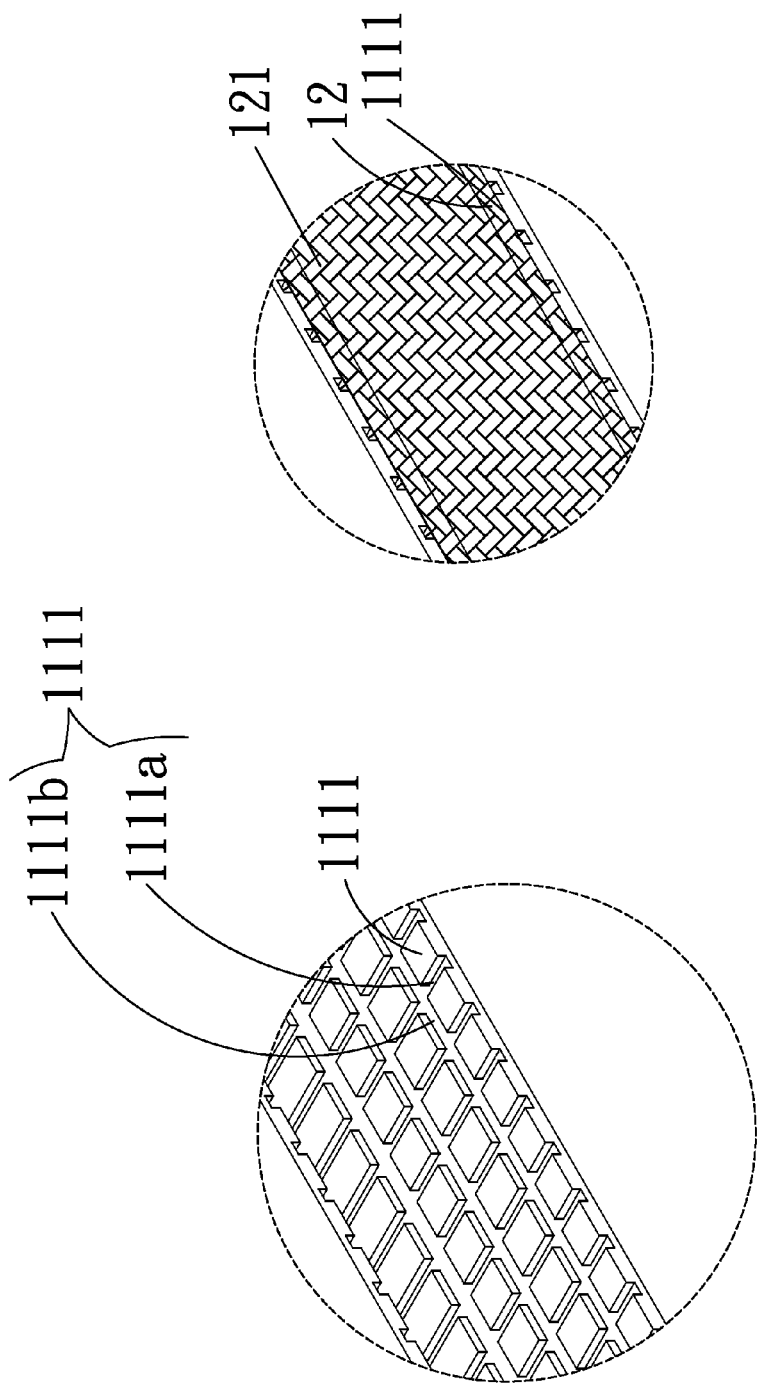

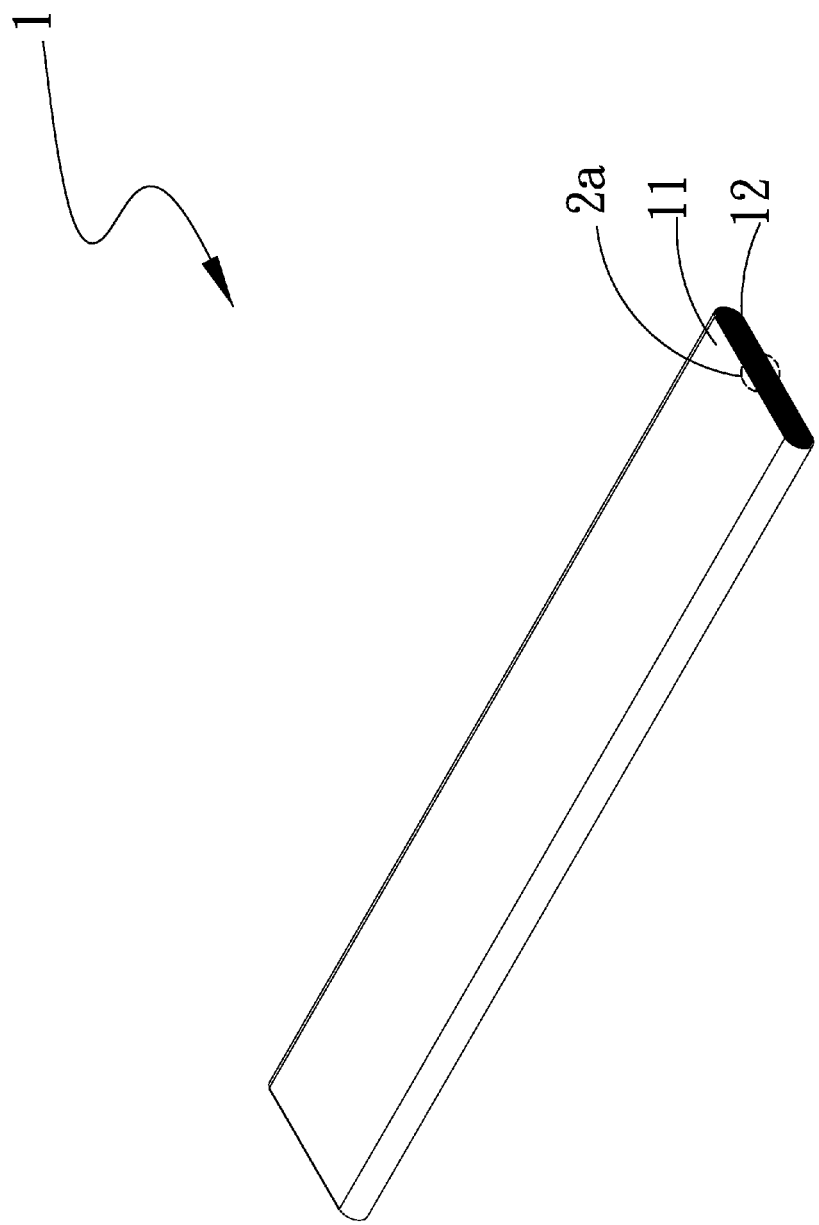

THIN HEAT PIPE STRUCTURE AND MANUFACTURING METHOD THEREOF

CROSS-REFERENCE TO RELATED APPLICATIONS

The present application is a division of U.S. patent application Ser. No. 13/154,690, filed on Jun. 7, 2011, titled Thin Heat Pipe Structure and Manufacturing Method Thereof, listing Hsiu-Wei Yang as inventor.

BACKGROUND OF THE INVENTION

1. Field of the Invention

The present invention relates generally to a thin heat pipe structure and a manufacturing method thereof. The thin heat pipe structure includes a tubular body and a mesh body. Multiple intersecting channels are formed on an inner wall face of the tubular body to increase vapor/liquid diffusion efficiency. The mesh body is attached to the inner wall face of the tubular body. The thin heat pipe structure is able to transfer heat in both axial direction and radial direction.

2. Description of the Related Art

A heat pipe has heat conductivity several times to several tens times that of copper, aluminum or the like. Therefore, the heat pipe has excellent performance and serves as a cooling component applied to various electronic devices. As to the configuration, the conventional heat pipes can be classified into heat pipes in the form of circular tubes and heat pipes in the form of flat plates. For cooling an electronic component such as a CPU, preferably a flat-plate heat pipe is used in view of easy installation and larger contact area. To catch up the trend toward miniaturization of cooling mechanism, the heat pipe has become thinner and thinner in adaptation to the cooling mechanism.

The heat pipe is formed with an internal space as a flow path for the working fluid contained in the heat pipe. The working fluid is converted between liquid phase and vapor phase through evaporation and condensation and is transferable within the heat pipe for transferring heat. The heat pipe is formed with sealed voids in which the working fluid is contained. The working fluid is phase-changeable and transferable to transfer heat.

The heat pipe is used as a heat conduction member. The heat pipe is fitted through a radiating fin assembly. The working fluid with low boiling point is filled in the heat pipe. The working fluid absorbs heat from a heat-generating electronic component (at the evaporation end) and evaporates into vapor. The vapor goes to the radiating fin assembly and transfers the heat to the radiating fin assembly (at the condensation end). A cooling fan then carries away the heat to dissipate the heat generated by the electronic component.

The heat pipe is manufactured in such a manner that metal powder is filled into a hollow tubular body and sintered to form a capillary structure layer on the inner wall face of the tubular body. Then the tubular body is vacuumed and filled with the working fluid and then sealed. On the demand of the electronic equipment for slim configuration, the heat pipe must be made with a thin configuration.

A heat spreader works in the same principle as the heat pipe. The working fluid is converted between liquid phase and vapor phase through evaporation and condensation for transferring heat. The heat spreader is only different from the heat pipe in that the heat pipe mainly transfers heat in axial direction, while the heat spreader transfers heat face to face by large area. In adaptation to the current thin electronic equipment, the heat pipe or heat spreader must be manufactured with a thin configuration.

In the conventional technique, the heat pipe is pressed into a flat-plate form. Before flattening the heat pipe, the powder is first filled into the heat pipe and then sintered. Then the working fluid is filled into the heat pipe. Finally, the heat pipe is sealed. Alternatively, the tubular body of the heat pipe is first pressed and flattened and then the powder is filled into the tubular body and sintered. However, the internal chamber of the tubular body is extremely narrow. Therefore, it is quite hard to fill the powder into the tubular body. Moreover, the capillary structure in the heat pipe needs to provide capillary attraction for transferring the working fluid on one hand and support the tubular body on the other hand. The support effect is quite limited in such a narrow space.

Furthermore, the vapor passageways in the heat pipe are so narrow that an effective vapor/liquid circulation can be hardly achieved. Therefore, the conventional thin heat pipe and the manufacturing method thereof have many defects.

The most serious problem existing in the conventional technique is that although the thin heat pipe has larger heat absorption area and heat dissipation area, the heat pipe can only transfer heat in axial direction, while failing to transfer heat in radial direction. According to the above, the conventional technique has the following shortcomings:
1. It is hard to process and manufacture the thin heat pipe.
2. The capillary structure in the heat pipe is subject to damage.
3. The manufacturing cost is higher.
4. The conventional thin heat pipe cannot transfer heat in radial direction.

SUMMARY OF THE INVENTION

A primary object of the present invention is to provide a thin heat pipe structure, which is able to transfer heat in both axial direction and radial direction.

A further object of the present invention is to provide a manufacturing method for a thin heat pipe structure.

To achieve the above and other objects, the thin heat pipe structure of the present invention includes a tubular body and a mesh body. The tubular body has a chamber. An inner wall face of the chamber is formed with at least one first channel and at least one second channel. The first and second channels extend to intersect each other. The mesh body has multiple meshes and is attached to the inner wall face of the chamber.

The manufacturing method for the thin heat pipe structure of the present invention includes steps of: preparing a hollow tubular body and a mesh body; forming at least one first channel and at least one second channel on an inner wall face of the tubular body; attaching the mesh body to the inner wall face of the tubular body; pressing the tubular body into a flat state; vacuuming the tubular body and filling working fluid into the tubular body; and sealing the tubular body.

The thin heat pipe structure is able to transfer heat in both axial direction and radial direction so that the heat transfer efficiency is greatly increased. By means of the manufacturing method, the heat pipe can be slimmed.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 1a is an enlarged view of a part of FIG. 1;

FIG. 2 is a perspective assembled view of the first embodiment of the thin heat pipe structure of the present invention;

FIG. 2a is an enlarged view of a part of FIG. 2;

DETAILED DESCRIPTION OF THE PREFERRED EMBODIMENTS

Figure 1:
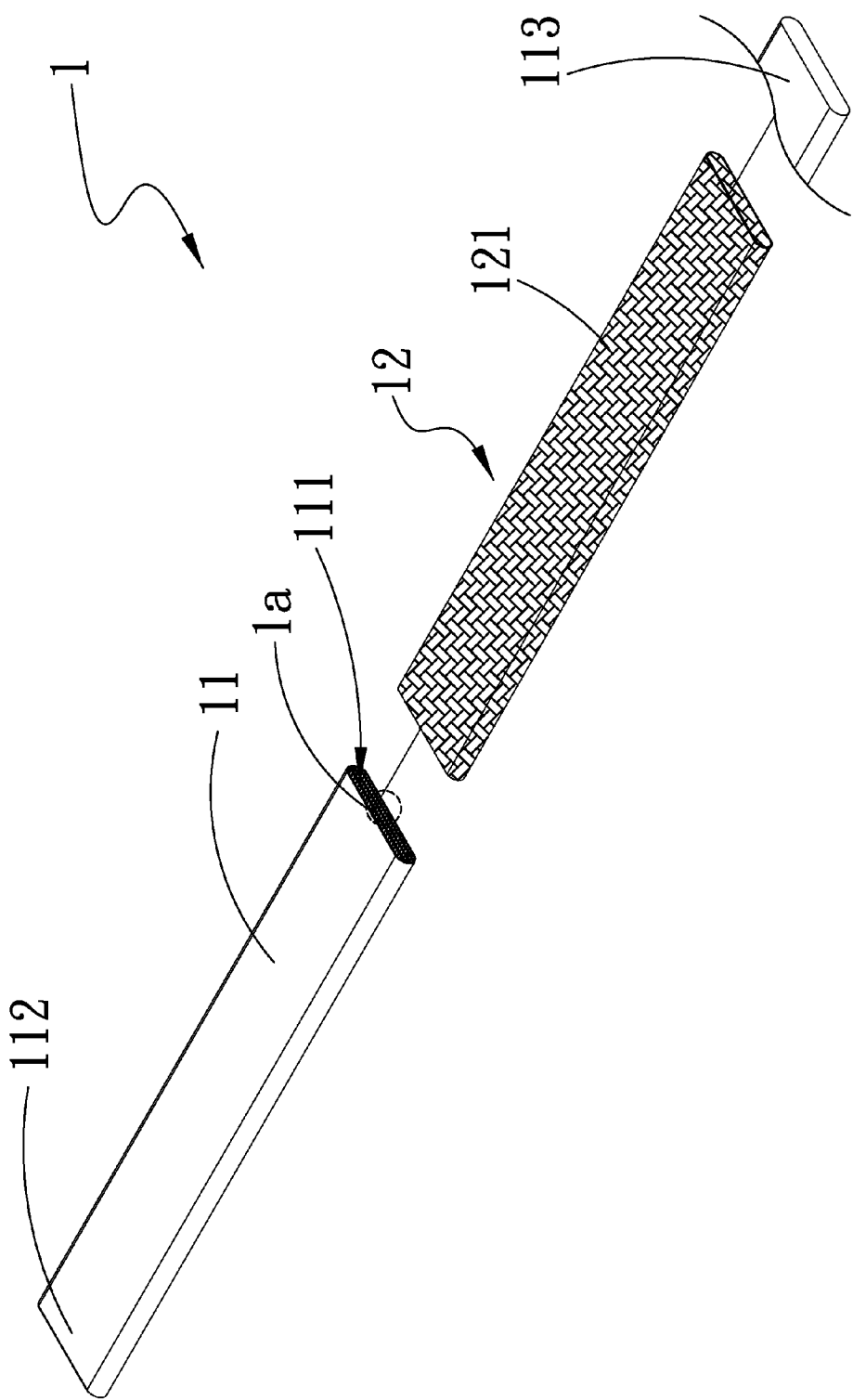
FIG. 1 is a perspective exploded view of a first embodiment of the thin heat pipe structure of the present invention.

Please refer to FIGS. 1, 1a, 2 and 2a. FIG. 1 is a perspective exploded view of a first embodiment of the thin heat pipe structure of the present invention. FIG. 1a is an enlarged view of a part of FIG. 1. FIG. 2 is a perspective assembled view of the first embodiment of the thin heat pipe structure of the present invention. FIG. 2a is an enlarged view of a part of FIG. 2. The thin heat pipe structure 1 includes a tubular body 11 and a mesh body 12.

Figure 8:
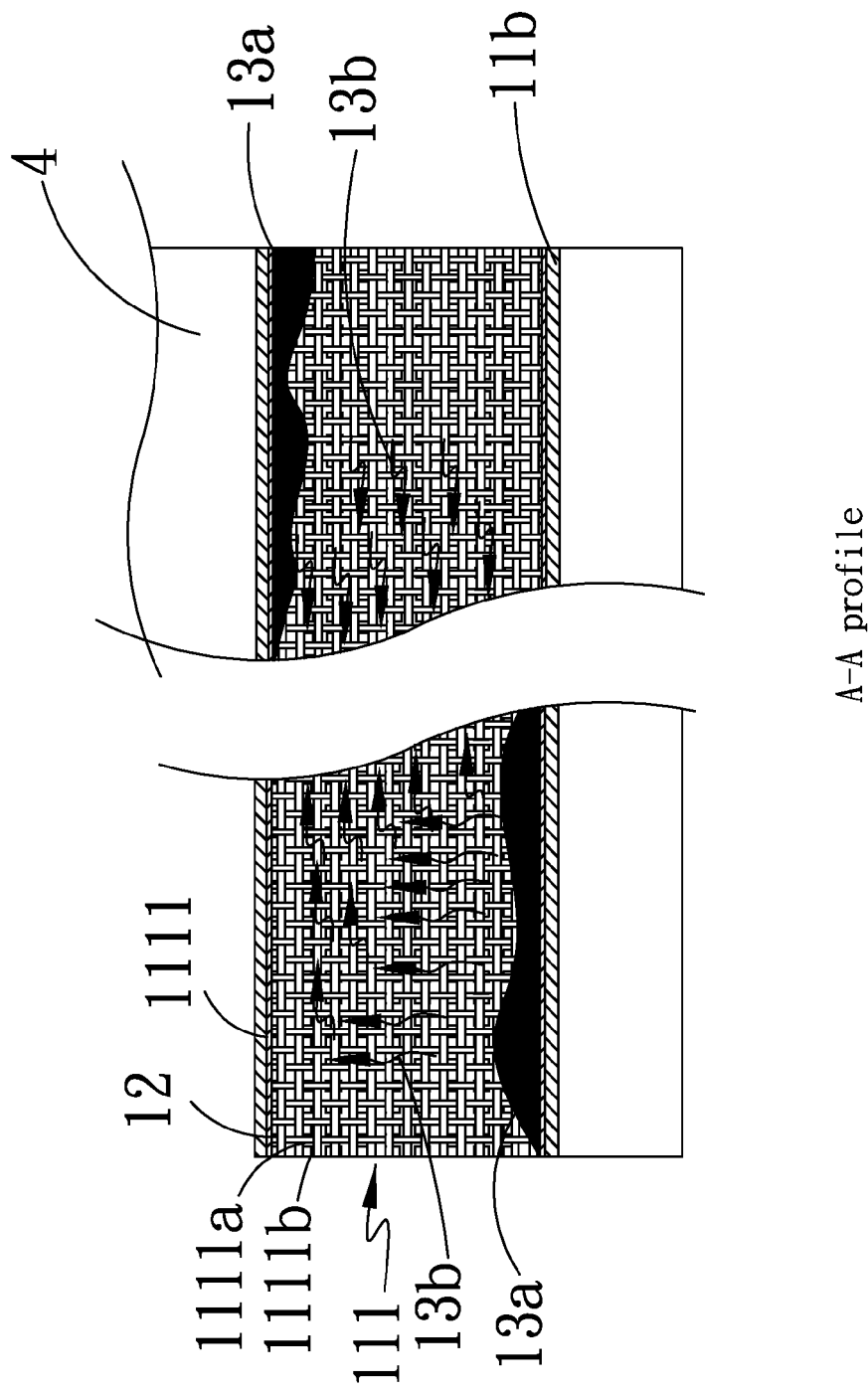
FIG. 8 is a sectional view taken along line A-A of FIG. 7.

The tubular body 11 has a chamber 111 and a working fluid 13 (as shown in FIG. 8). An inner wall face 1111 of the chamber 111 is formed with at least one first channel 1111a and at least one second channel 1111b. The first and second channels 1111a, 1111b extend to intersect each other.

The mesh body 12 has multiple meshes 121. The mesh body 12 is attached to the inner wall face 1111 of the chamber 111.

The tubular body 11 further has a first closed end 112 and a second closed end 113 in communication with the chamber 111.

Figure 3:
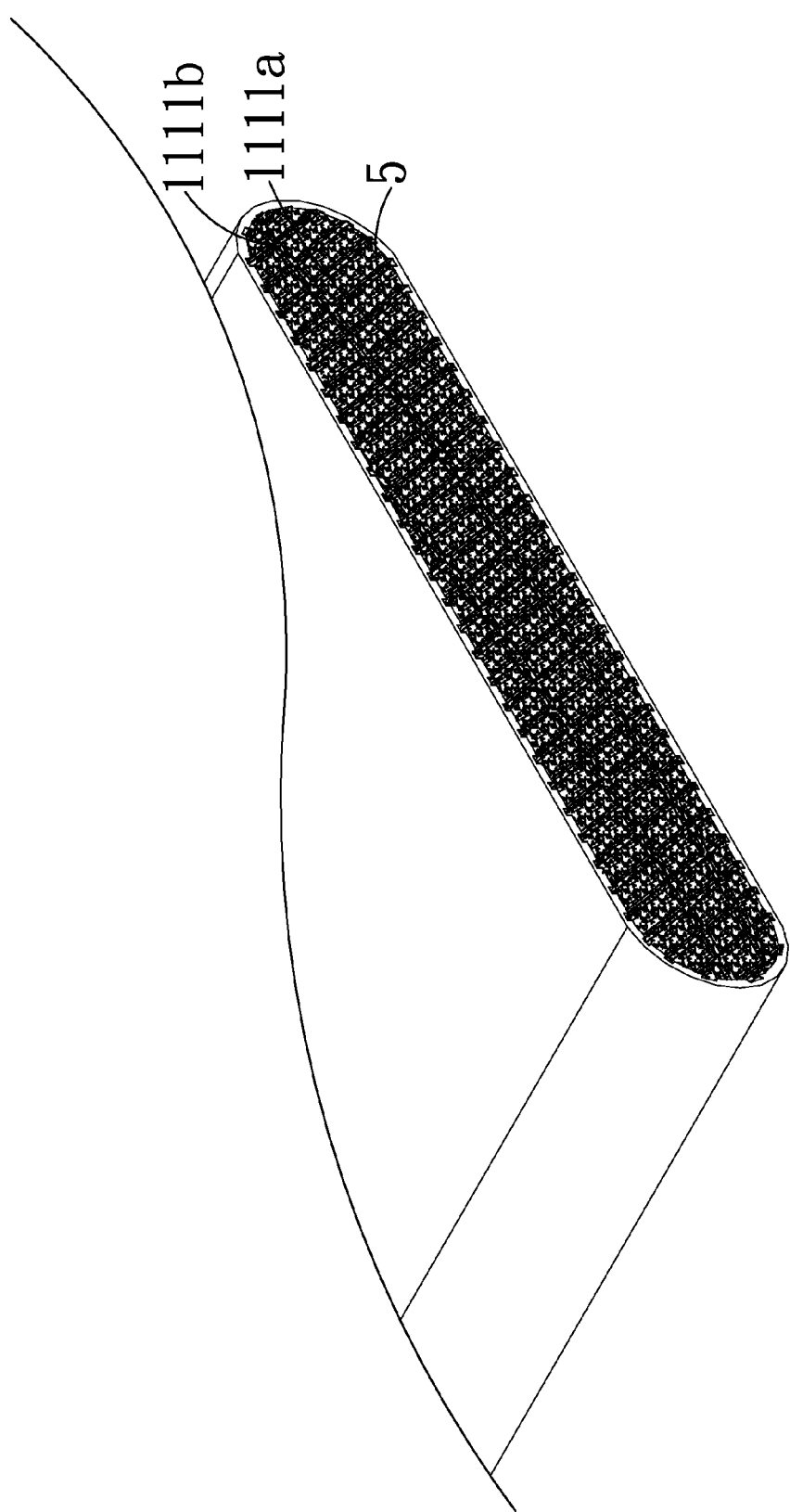
FIG. 3 is a perspective assembled sectional view of a second embodiment of the thin heat pipe structure of the present invention.

Please refer to FIG. 3, which is a perspective assembled sectional view of a second embodiment of the thin heat pipe structure of the present invention. The second embodiment is substantially identical to the first embodiment in structure and thus will not be repeatedly described hereinafter. The second embodiment is only different from the first embodiment in that the surfaces of the first and second channels 1111a, 1111b have sintered powder 5. The sintered powder 5 can be copper powder or aluminum powder. In this embodiment, the sintered powder 5 is, but not limited to, copper powder.

Figure 4:
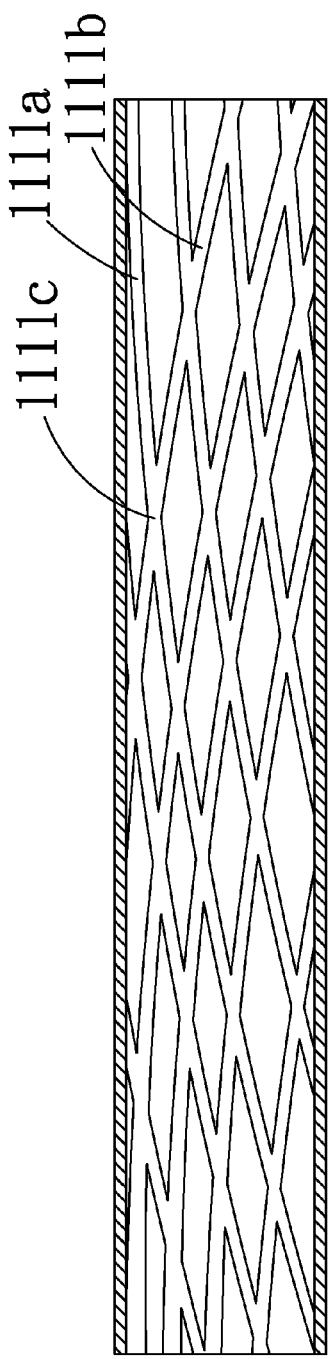
FIG. 4 is a sectional view of a third embodiment of the thin heat pipe structure of the present invention.

Please refer to FIG. 4, which is a sectional view of a third embodiment of the thin heat pipe structure of the present invention. The third embodiment is substantially identical to the first embodiment in structure and thus will not be repeatedly described hereinafter. The third embodiment is only different from the first embodiment in that the first channels 1111a extend in an arcuate form and the second channels 1111b also extend in an arcuate form. The first and second channels 1111a, 1111b intersect each other at at least one intersection section 1111c.

Figure 5:
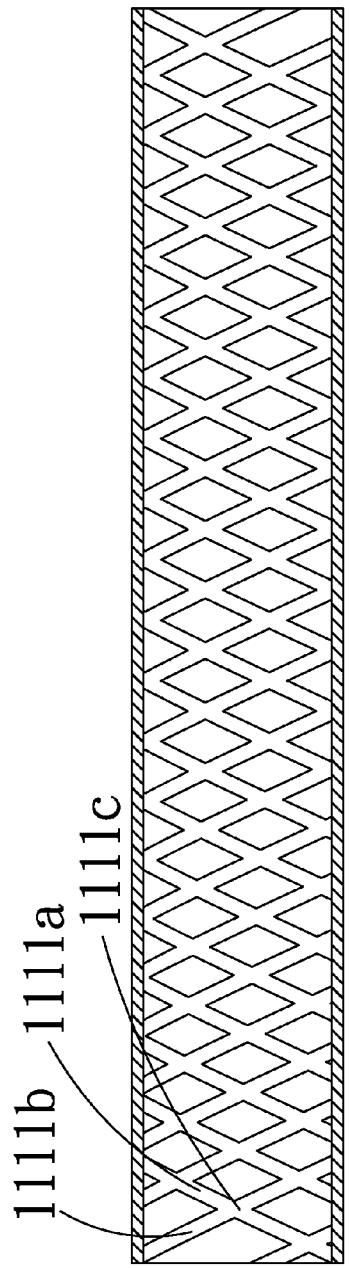
FIG. 5 is a sectional view of a fourth embodiment of the thin heat pipe structure of the present invention.

Please refer to FIG. 5, which is a sectional view of a fourth embodiment of the thin heat pipe structure of the present invention. The fourth embodiment is substantially identical to the first embodiment in structure and thus will not be repeatedly described hereinafter. The fourth embodiment is only different from the first embodiment in that the first channels 1111a extend in a spiral form and the second channels 1111b also extend in a spiral form. The first and second channels 1111a, 1111b intersect each other at at least one intersection section 1111c.

Figure 6:
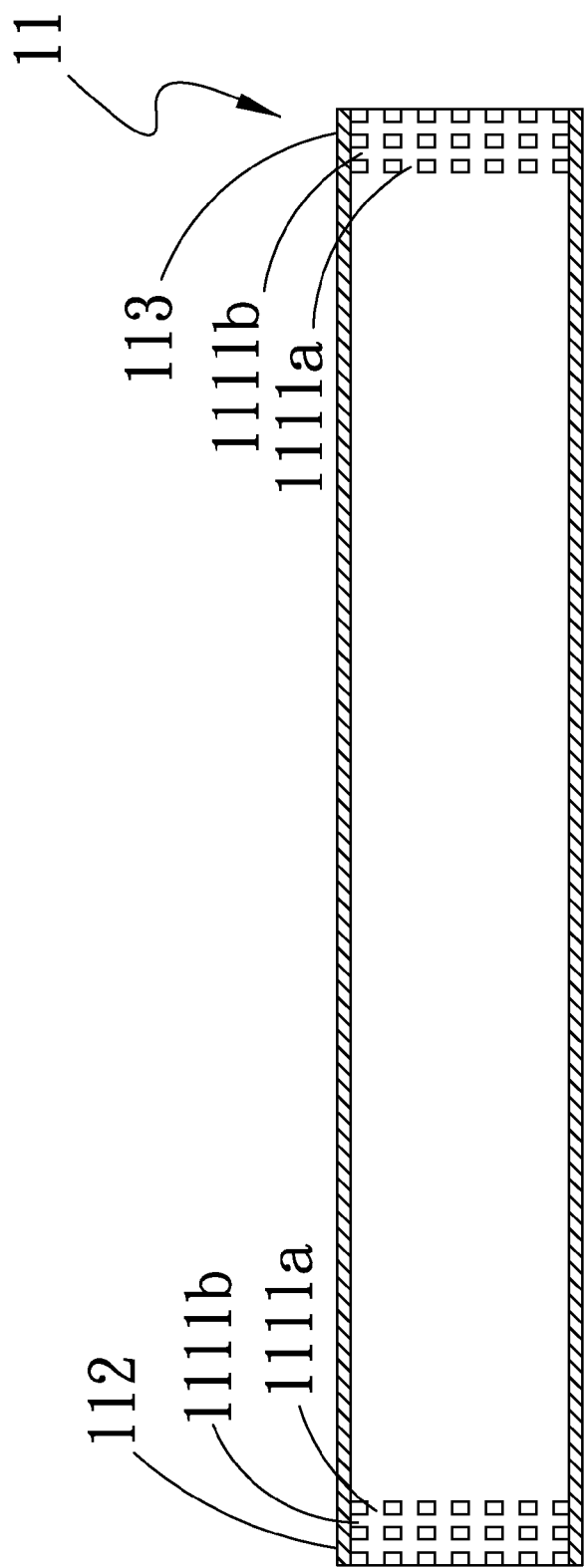
FIG. 6 is a sectional view of a fifth embodiment of the thin heat pipe structure of the present invention.

Please refer to FIG. 6, which is a sectional view of a fifth embodiment of the thin heat pipe structure of the present invention. The fifth embodiment is substantially identical to the first embodiment in structure and thus will not be repeatedly described hereinafter. The fifth embodiment is only different from the first embodiment in that the first and second channels 1111a, 1111b are only formed in positions adjacent to the first and second closed ends 112, 113 of the tubular body 11.

Figure 7:
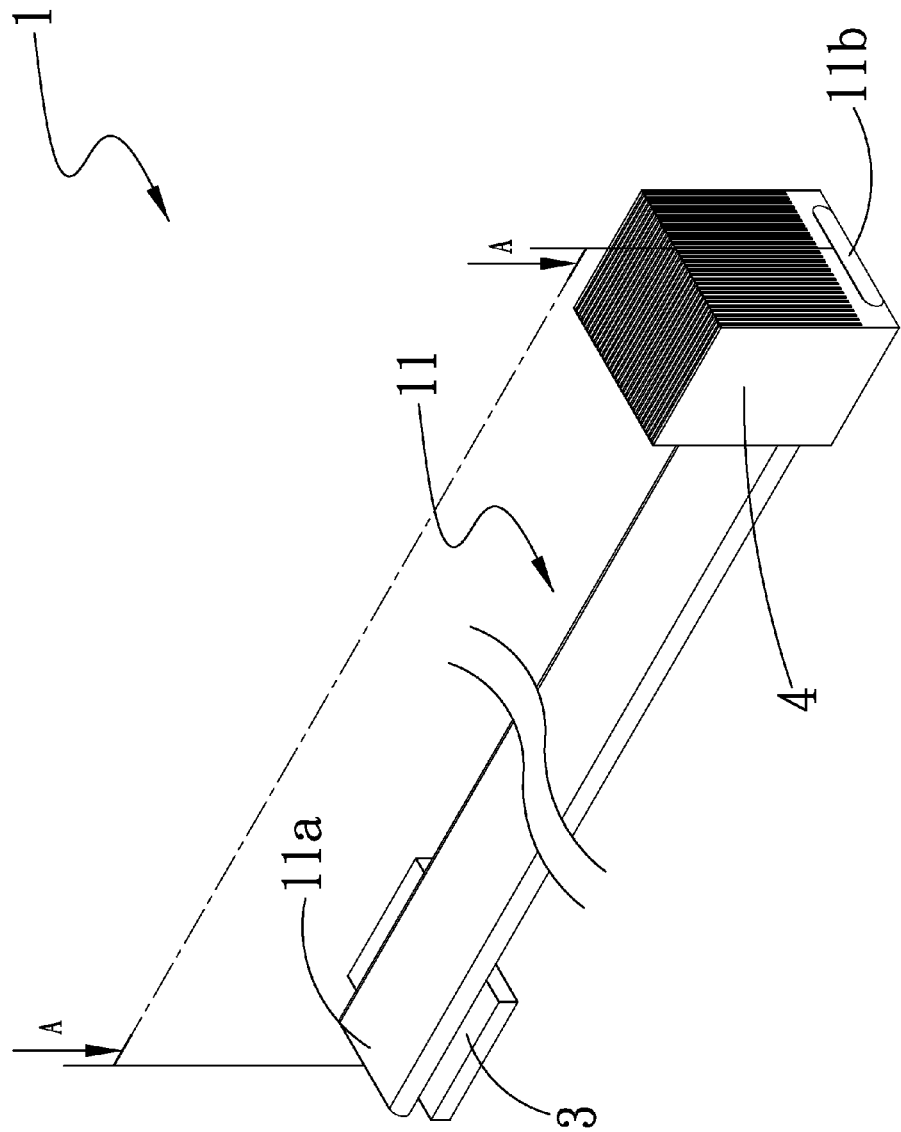
FIG. 7 shows an application of the thin heat pipe structure of the present invention.

Please refer to FIGS. 7 and 8. FIG. 7 shows an application of the thin heat pipe structure of the present invention. FIG. 8 is a sectional view taken along line A-A of FIG. 7. The tubular body 11 has a heat absorption end 11a and a heat dissipation end 11b. The heat absorption end 11a is in contact with at least one heat source 3, while the heat dissipation end 11b is in contact with at least one heat dissipation member 4. In this embodiment, the heat dissipation member 4 is, but not limited to, a heat sink. When the heat source 3 generates heat, the heat absorption end 11a absorbs the heat to make the liquid working fluid 13a evaporate into the vapor working fluid 13b. The vapor working fluid 13b goes through the voids in the mesh body 12 toward the heat dissipation end 11b. Then the vapor working fluid 13b is cooled and condensed into the liquid working fluid 13a. The liquid working fluid 13a then axially and radially flows along and spreads through the first and second channels 1111a, 1111b of the inner wall face 1111 of the chamber 111 back to the heat absorption end 11a.

Figure 9:
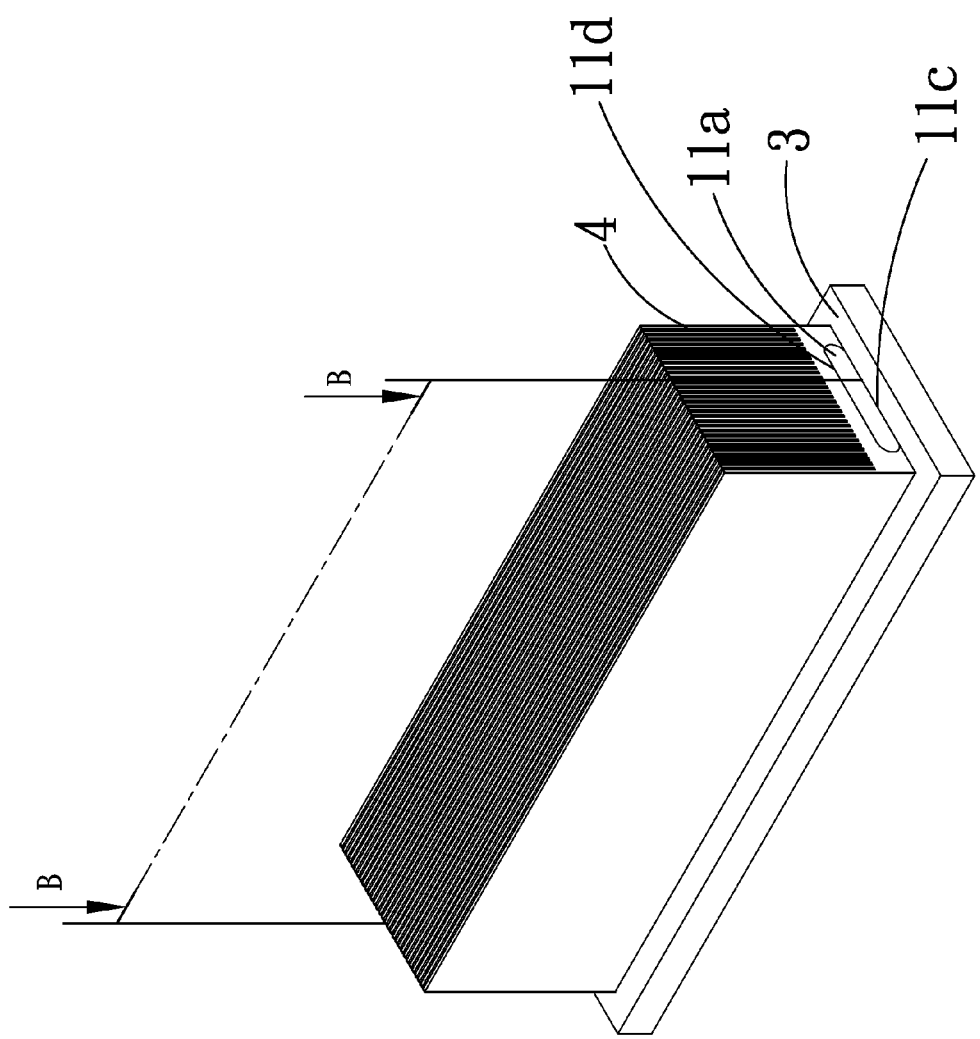
FIG. 9 shows another application of the thin heat pipe structure of the present invention.
Figure 10:
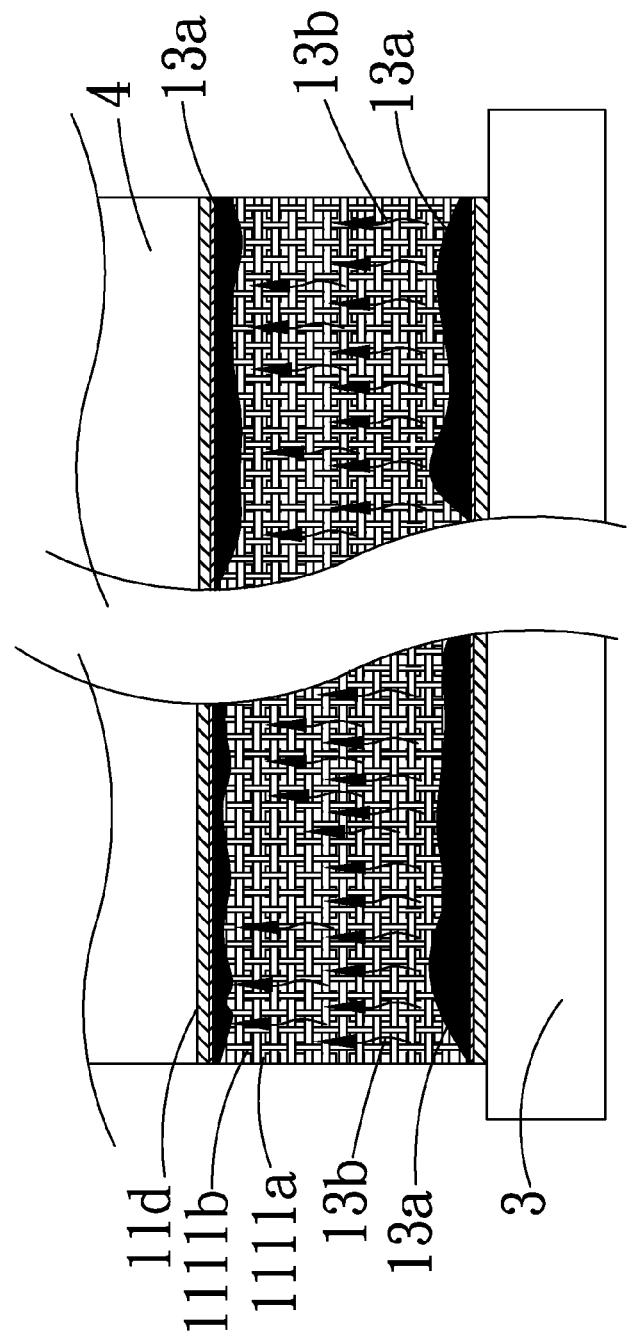
FIG. 10 is a sectional view taken along line B-B of FIG. 9.

Please refer to FIGS. 9 and 10. FIG. 9 shows another application of the thin heat pipe structure of the present invention. FIG. 10 is a sectional view taken along line B-B of FIG. 9. One side of the heat absorption end 11a is in contact with the heat source 3 and defined as a heat absorption side 11c, while the other side of the heat absorption end 11a opposite to the heat absorption side 11c is defined as a heat dissipation side 11d. The heat dissipation member 4 is disposed on the heat dissipation side 11d. When the heat source 3 generates heat, the heat absorption side 11c absorbs the heat to make the liquid working fluid 13a evaporate into the vapor working fluid 13b. The vapor working fluid 13b goes to the heat dissipation side 11d and is cooled and condensed into the liquid working fluid 13a. The liquid working fluid 13a then flows along the first and second channels 1111a, 1111b back to the heat absorption side 11c for next vapor/liquid cycle.

Figure 11:
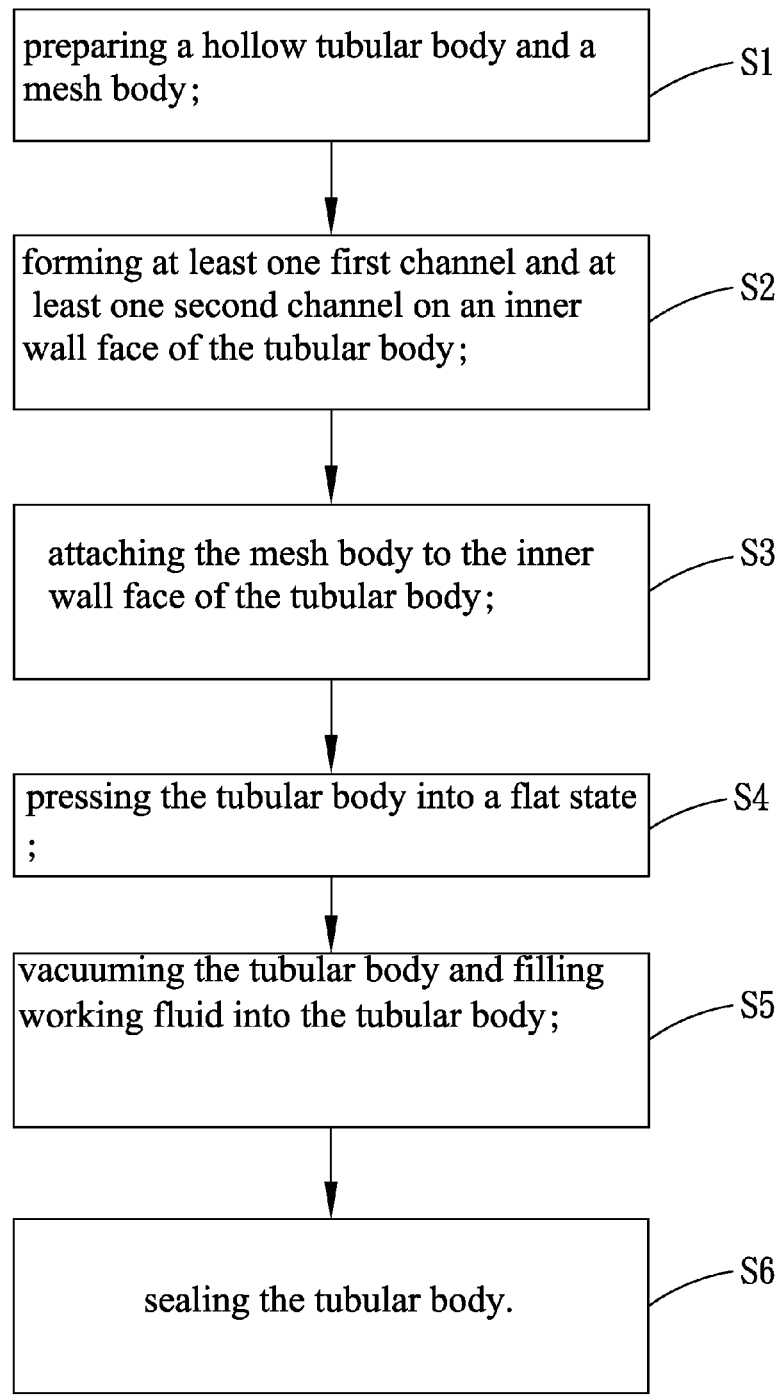
FIG. 11 is a flow chart of a first embodiment of the manufacturing method for the thin heat pipe structure of the present invention.
Figure 12:
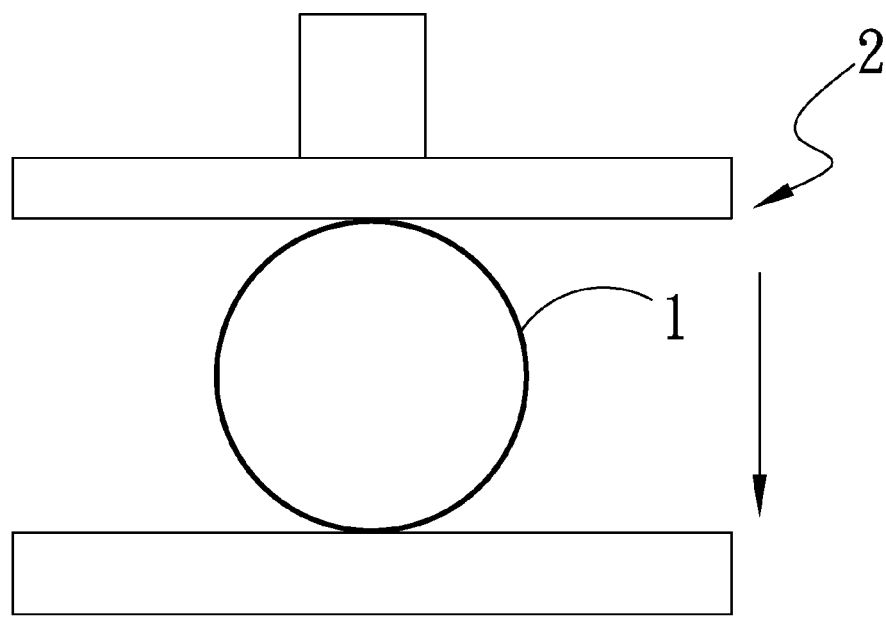
FIG. 12 shows a processing step of the manufacturing method for the thin heat pipe structure of the present invention.
Figure 13:
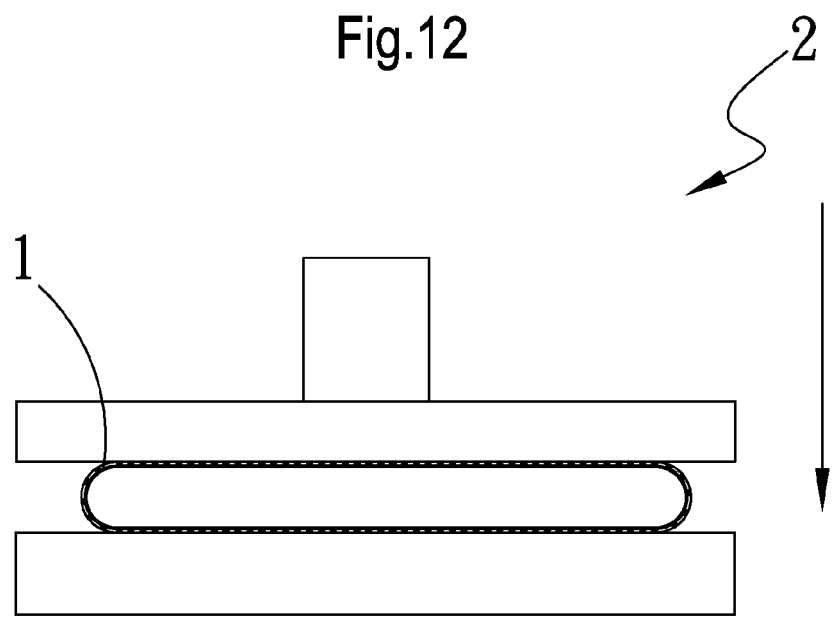
FIG. 13 also shows the processing step of the manufacturing method for the thin heat pipe structure of the present invention.

The thin heat pipe structure 1 of the present invention not only is able to transfer heat axially, but also is able to transfer heat radially. Moreover, the mesh body 12 serves to increase strength of the thin heat pipe structure 1. Please refer to FIGS. 11, 12 and 13. FIG. 11 is a flow chart of a first embodiment of the manufacturing method for the thin heat pipe structure of the present invention. FIG. 12 shows a processing step of the manufacturing method for the thin heat pipe structure of the present invention. FIG. 13 shows another processing step of the manufacturing method for the thin heat pipe structure of the present invention. Also referring to FIGS. 1, 2, 4 and 5, the manufacturing method for the thin heat pipe structure of the present invention includes steps of:

S1: preparing a hollow tubular body and a mesh body, a hollow tubular body 11 and a mesh body 12 being prepared, the hollow tubular body 11 and the mesh body 12 being made of a metal material with good heat conductivity, such as copper material or aluminum material, in this embodiment, the metal material is, but not limited to, copper material;

S2: forming at least one first channel and at least one second channel on an inner wall face of the tubular body, at least one first channel 1111a and at least one second channel 1111b being formed on the surface of the internal chamber 111 of the tubular body 11 by means of mechanical processing (such as turning), the first and second channels 1111a, 1111b extending in a linear form (as shown in FIG. 1) or in an arcuate form (as shown in FIG. 4) or in a spiral form (as shown in FIG. 5);

S3: attaching the mesh body to the inner wall face of the tubular body, the mesh body 12 being placed into the chamber 111 of the tubular body 11 and snugly attached to the inner wall face 1111 of the chamber 111 of the tubular body 11 to cover the first and second channels 1111a, 1111b;

S4: pressing the tubular body into a flat state, the tubular body 11 being placed onto a press machine 2 and pressed into a flat state by means of pressing;

S5: vacuuming the tubular body and filling working fluid into the tubular body, the chamber 111 of the flattened tubular body 11 being vacuumed and filled with the working fluid 13; and S6: sealing the tubular body, the open end of the tubular body 11, which is vacuumed and filled with the working fluid 13 being sealed.

Please further refer to FIG. 11, which is a flow chart of a second embodiment of the manufacturing method for the thin heat pipe structure of the present invention. Also referring to FIGS. 1 and 2, the manufacturing method for the thin heat pipe structure of the present invention includes steps of:

S1: preparing a hollow tubular body and a mesh body;
S2: forming at least one first channel and at least one second channel on an inner wall face of the tubular body;
S3: attaching the mesh body to the inner wall face of the tubular body;
S4: pressing the tubular body into a flat state;
S5: vacuuming the tubular body and filling working fluid into the tubular body; and
S6: sealing the tubular body.

The second embodiment of the manufacturing method for the thin heat pipe structure of the present invention is substantially identical to the first embodiment and thus will not be repeatedly described hereinafter. The second embodiment is only different from the first embodiment in that in step S2, at least one first channel 1111a and at least one second channel 1111b are formed on the inner wall face 1111 of the internal chamber 111 of the tubular body 11 by means of milling.

Figure 14:
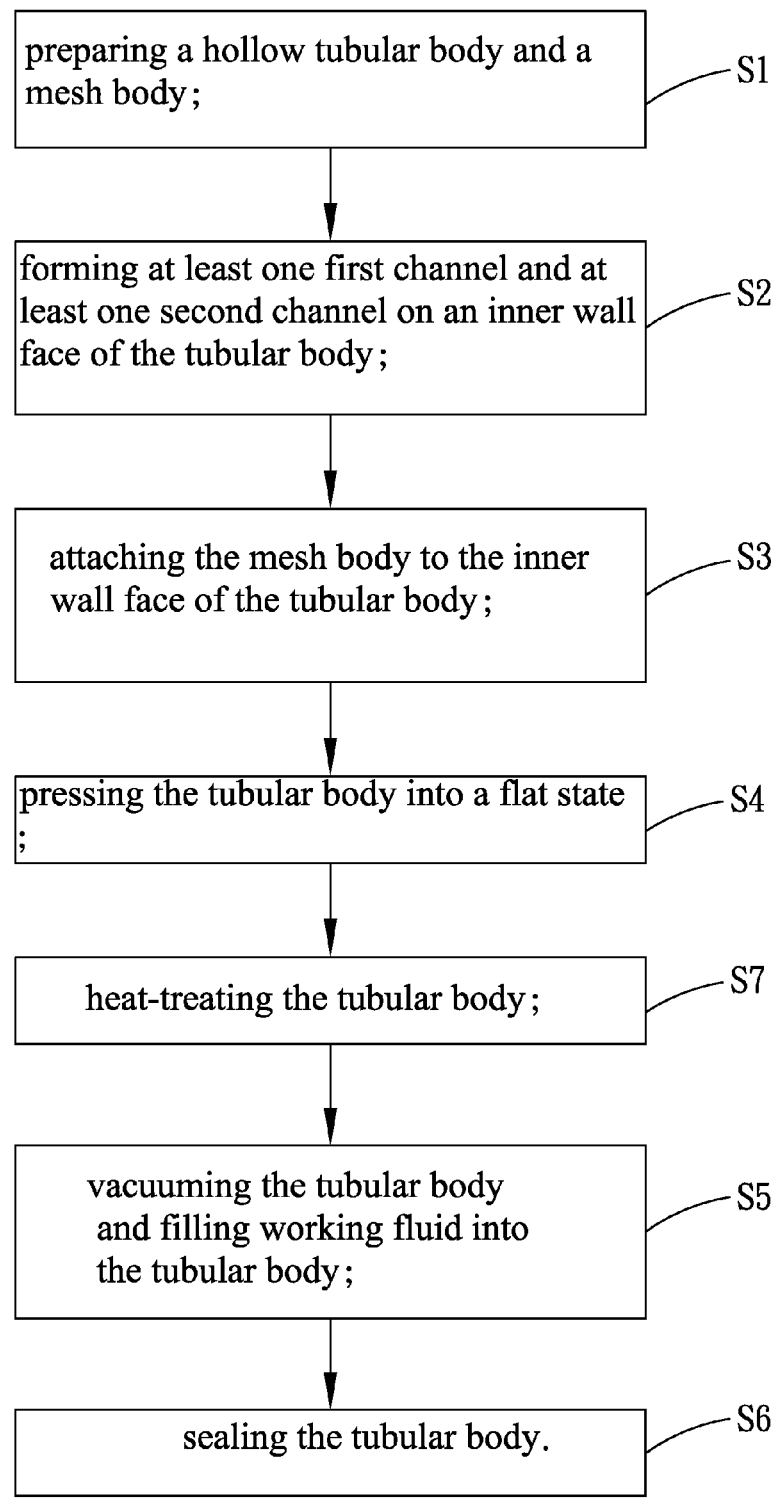
FIG. 14 is a flow chart of a third embodiment of the manufacturing method for the thin heat pipe structure of the present invention.

Please further refer to FIG. 14, which is a flow chart of a third embodiment of the manufacturing method for the thin heat pipe structure of the present invention. Also referring to FIGS. 1 and 2, the manufacturing method for the thin heat pipe structure of the present invention includes steps of:

S1: preparing a hollow tubular body and a mesh body;
S2: forming at least one first channel and at least one second channel on an inner wall face of the tubular body;
S3: attaching the mesh body to the inner wall face of the tubular body;
S4: pressing the tubular body into a flat state;
S7: heat-treating the tubular body;
S5: vacuuming the tubular body and filling working fluid into the tubular body; and
S6: sealing the tubular body.

The third embodiment of the manufacturing method for the thin heat pipe structure of the present invention is substantially identical to the first embodiment and thus will not be repeatedly described hereinafter. The third embodiment is only different from the first embodiment in that the third embodiment further includes a step S7 of heat-treating the tubular body between step S4 and step S5. The hollow tubular body 11 and the mesh body 12 disposed in the tubular body 11 are heated by means of heat treatment. In this embodiment, the heat treatment is, but not limited to, diffusion bonding. The mesh body 12 can be more securely attached to and connected with the tubular body 11 by means of diffusion bonding to enhance heat conduction efficiency.

The thin heat pipe structure of the present invention is able to transfer heat both axially and radially. Therefore, the thin heat pipe structure of the present invention has very good heat transfer performance in both axial direction and radial direction by large heat transfer area.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A manufacturing method for a thin heat pipe structure, comprising steps of:
preparing a hollow tubular body and a mesh body, the tubular body having two open ends;
forming at least one first channel and at least one second channel on an inner wall face of each end of the tubular body, the first and second channels being formed only in positions adjacent to the two ends of the tubular body, the first and second channels extending to intersect each other;
attaching the mesh body to the inner wall face of the tubular body;
pressing the tubular body into a flat state;
vacuuming the tubular body and filling working fluid into the tubular body; and
sealing the two ends of the tubular body to form a first closed end as a front end and a second closed end as a rear end; wherein the first and second channels are formed only in the positions adjacent to the first closed end as the front end and the second closed end as the rear end, and no channels are formed on the inner wall face of the tubular body between the first and second channels formed adjacent to the first and second closed ends.

2. The manufacturing method for the thin heat pipe structure as claimed in claim 1, further comprising a step of heat-treating the tubular body after the step of pressing the tubular body into the flat state, the tubular body and the mesh body disposed in the tubular body being heated by means of heat treatment after pressed into the flat state.

3. The manufacturing method for the thin heat pipe structure as claimed in claim 2, wherein the heat treatment is diffusion bonding.

4. The manufacturing method for the thin heat pipe structure as claimed in claim 1, wherein in the step of pressing the tubular body into the flat state, the tubular body is flattened by means of pressing.

5. The manufacturing method for the thin heat pipe structure as claimed in claim 1, wherein in the step of forming at least one first channel and at least one second channel on the inner wall face of the tubular body, the first and second channels are formed by means of turning or milling.

\* \* \* \* \*